United States Patent [19]

Cachon

[11] 4,198,159

[45] Apr. 15, 1980

[54] OPTICAL ALIGNMENT SYSTEM IN PROJECTION PRINTING

[75] Inventor: Rene P. Cachon, Wappingers Falls, N.Y.

[73] Assignee: International Business Machines Corporation, Armonk, N.Y.

[21] Appl. No.: 974,574

[22] Filed: Dec. 29, 1978

[51] Int. Cl.² .................. G03B 27/52; G03B 27/58; G01B 11/27
[52] U.S. Cl. .................................... 355/55; 355/72; 356/399
[58] Field of Search .................................. 355/53–62, 355/72–74, 63; 356/138, 399

[56] References Cited

U.S. PATENT DOCUMENTS

| | | | |
|---|---|---|---|
| 3,497,705 | 2/1970 | Adler | 355/53 X |
| 3,704,657 | 12/1972 | Slikowski et al. | 355/53 X |
| 4,068,947 | 1/1978 | Buckley et al. | 355/72 |
| 4,084,903 | 4/1978 | Pircher | 355/53 |
| 4,093,378 | 6/1978 | Horr et al. | 355/53 X |

*Primary Examiner*—L. T. Hix
*Assistant Examiner*—W. J. Brady
*Attorney, Agent, or Firm*—Henry Powers

[57] ABSTRACT

Apparatus for placing a resist coated semiconductor wafer surface in the image plane of an optical system by means of three drivers (e.g. actuated flexure joints), with non-contact sensing (e.g. air gauges) at each driver providing individual feedback thereto to move the wafer into the image plane.

10 Claims, 9 Drawing Figures

OPTICAL ALIGNMENT SYSTEM IN PROJECTION PRINTING

Description

Technical Field

This invention relates to optical focusing systems and, more particularly, to a system for accurately positioning a major planar surface of a semiconductor wafer in the image plane of a projected pattern such as employed in the fabrication of integrated circuits.

As will appear from the following description, the focusing system of the invention, as well as the individual features of novelty of the system, may be employed for a variety of purposes. However, the invention is concerned primarily with projection printing of patterns in a photoresist coating on oxidized semiconductor wafers for fabrication of integrated circuits. For this reason, the invention will be described in connection with this primary application.

Accordingly, one object of the present invention is to provide a positioning system which is capable of precise adjustment of the attitude of a planar surface concurrently with the alignment of the surface within a reference plane.

Another object of the present invention is to provide a focusing system for aligning a planar surface within an image plane of a projected pattern.

Another object of the present invention is to provide a positioning system which is capable of precise adjustment of the attitude of the surface of a resist coated semiconductor wafer concurrently with the alignment of the surface within a reference plane.

Another object of the present invention is to provide a positioning system for accurately aligning a surface of a photoresist coated wafer in the image plane of a projected pattern such as employed in the fabrication of integrated circuits.

Background Art

The fabrication of integrated circuits typically requires successive treatments which involves a series of operations (e.g. etchings, diffusions, metallization, etc.) each of which employs a mask of predetermined design. The masks can be formed by use of a master array containing geometrical patterns which are projected on a photoresist coating, on a semiconductor wafer, by illumination from a suitable source to modify the photoresist where subjected to light to adapt the photoresist to etching operations in accordance with the nature of the photoresist, e.g. positive or negative. In projection printing, suitable illumination is passed through the master array to project an image of the geometrical patterns in a focus or image plane in which the resist coated wafer is positioned and aligned. See for example, the article "Semiconductor Levelling Systems" by J. W. Buechele, pp. 3255-56 of the IBM Technical Disclosure Bulletin, V.16, n.10, March 1974. In this respect, it may be noted that the fabrication of semiconductor devices may require as few as four or as many as twenty-five or more individual photoresist steps employing different master arrays or masks. Conversely, each wafer when processed may have several hundred to several thousand devices thereon with from 5 to 700 circuit elements in each device. Also, each individual device may measure as small as a few thousands of an inch long and wide, with electrodes and individual indicia thereon measured in a few ten thousands of an inch. In view of such densities and in light of trend for increased miniaturization, it is critical that each successive mask pattern must coincide in exact registration with the wafer relative to the prior processing stages of fabrication.

Apparatus for positioning of workpieces or wafers is known in the art. One particularly effective system is that shown in U.S. Pat. No. 4,068,947 issued Jan. 17, 1978 to J. D. Buckley et al. and with which the present invention can be employed; and thus accordingly the teachings of this U.S. Pat. No. 4,068,947 are incorporated herein by reference thereto. This patent describes a projection printing system and the alignment or registration of a semiconductor wafer in four coordinates: two lateral dimensions X and Y, a vertical dimension Z that is perpendicular to the face of the wafer, and rotation $\theta$ about the center of the wafer. Vertical orientation Z of the wafer to bring its face into the image plane, of the projection system, is obtained by abutment of peripherally spaced edge portions of a wafer against the faces of equiangularly spaced reference pads of an adapter ring mounted on an $XY\theta$ plate, which pad faces lie in the image plane in a co-planar relationship. Since the reference pad faces are co-planar with the image plane, it can be logically concluded that the proper attitude of the wafer is obtained concurrently with the orientation of its surface in the image plane.

Although the system of this U.S. Pat. No. 4,068,947 provides an excellent means for orientation of a semiconductor wafer in the $XY\theta$ coordinates, the system is, however, characterized with disadvantages in operations directed to positioning and alignment of photoresist coated wafer surfaces in the image plane of the projection system. Not only do the reference pads eliminate the availability of the contacted wafer portion for device fabrication, but deviations are encountered in the positioning of wafer surface in the image or focal plane where the wafer includes tapered or "roll off" portions at its periphery. Also, when the reference pads contact photoresist coating of the wafers, transfer of the resist to the pad faces occurs with eventual buildup of the resist on the reference pad faces to a point which interferes with the accurate positioning of the wafer surface in relationship to the optimum focal or image plane of the system. This necessitates frequent pad cleaning for removal of the resist to prevent unacceptable device loss, as well as resulting in down-time which reduces yield in device fabrication.

Disclosure of the Invention

By means of a precision air sensing technique and three sets of flexure joints, driven by an electropneumatic system, the front faces or surfaces can be placed within ±20 microinches of the focal plane of an optical system.

Figure 1:
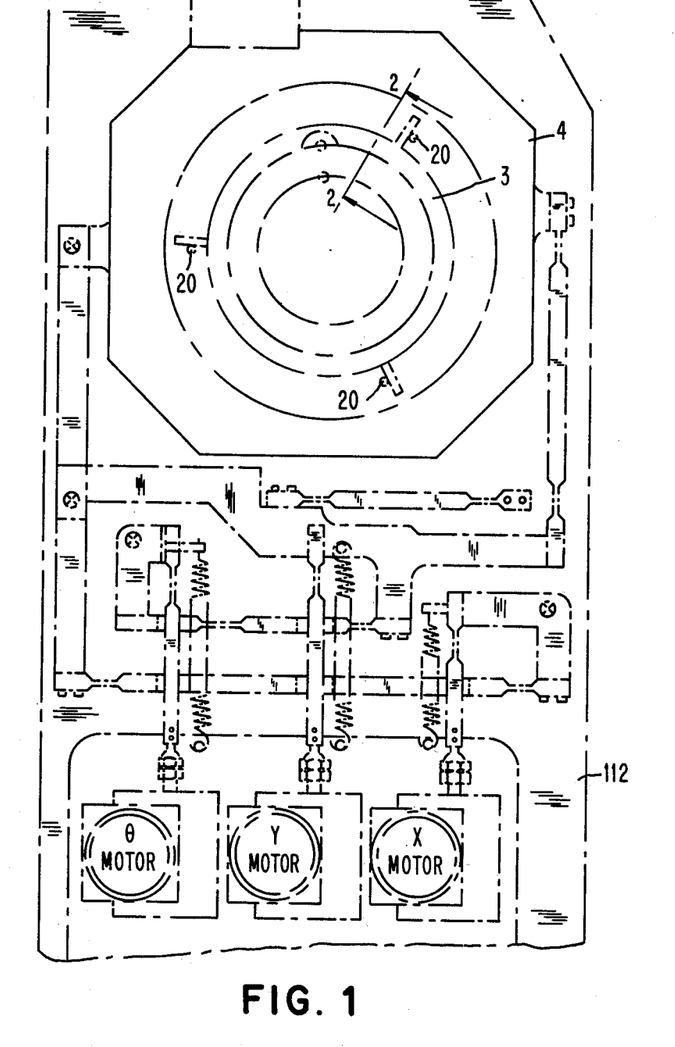
FIG. 1 is a plan view illustrating the invention in its intended environment.
Figure 2:
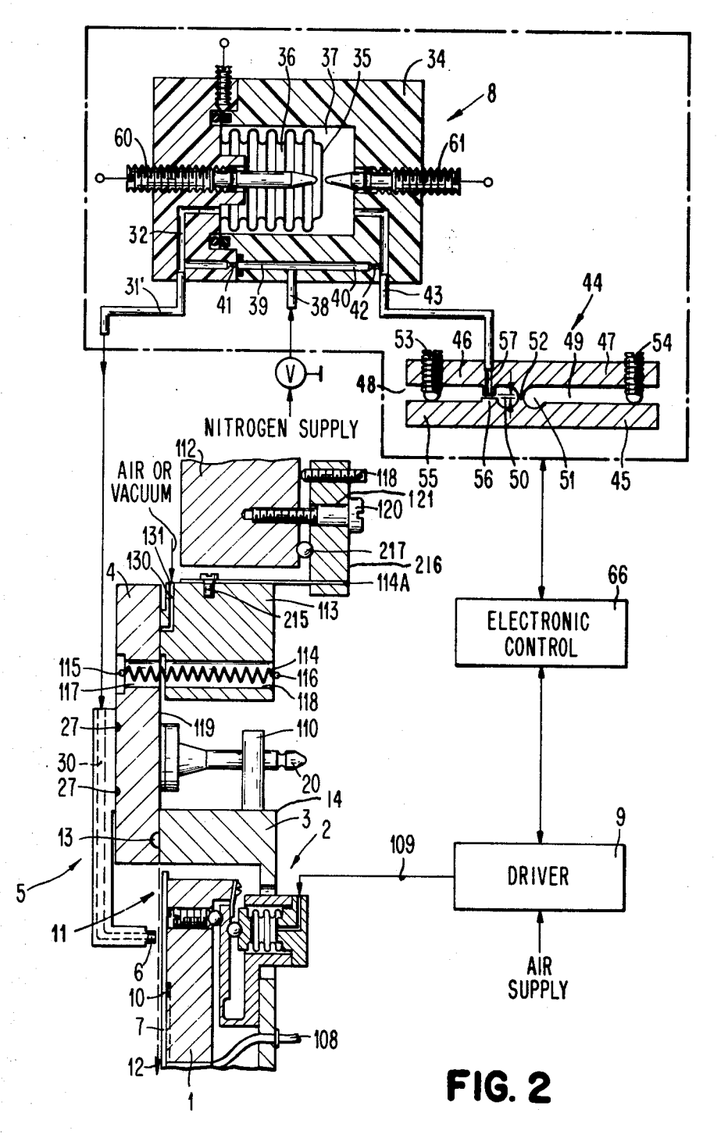
FIG. 2 is a partial view in section along lines 2—2 of FIG. 1.
Figure 3:
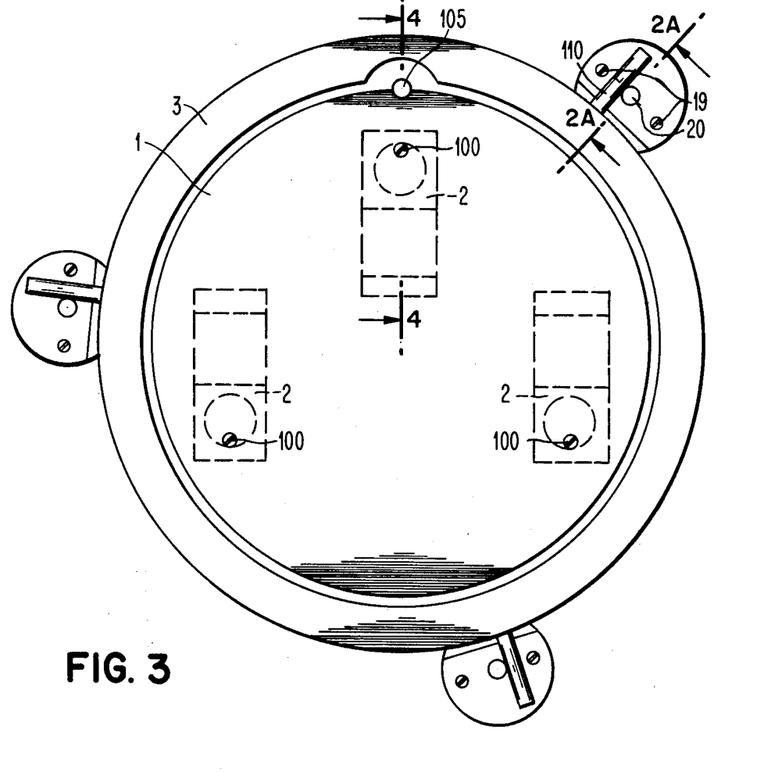
FIG. 3 is a plan view of the chuck unit in the preceding figure.
Figure 3A:
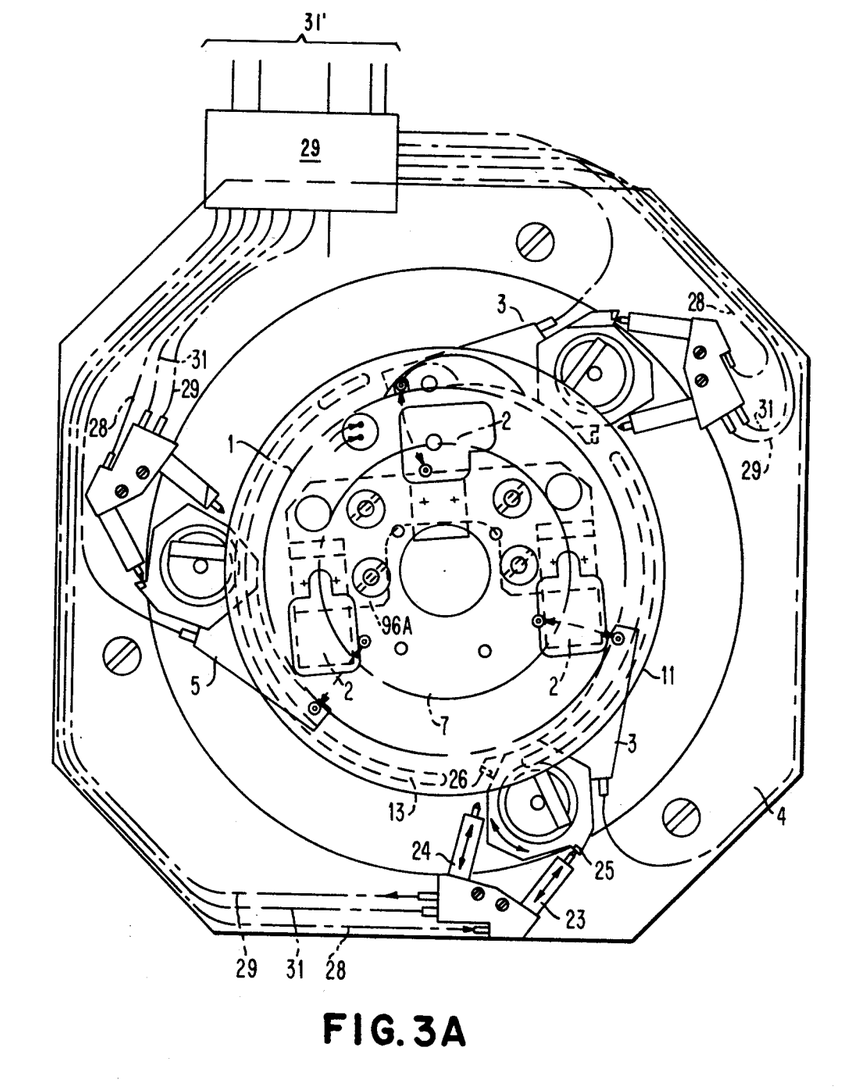
FIG. 3A is a bottom view of the support plate and substructures on the support plate 4 in FIG. 1.

Referring to the drawings, particularly FIG. 2 where the levelling and focusing system is shown, the system comprises a levelling plate or chuck pedestal 1 which is mounted for reciprocation on three pneumatically actuated flexure units 2 (FIGS. 1, 2 and 3) equiangularly disposed (e.g. 120° apart) relative to each other. In turn, the flexure units are mounted within a chuck cup or socket 3 which is mounted to a support plate 4 for prerequisition of the system relative to a focal plane. As will be described below, support plate 4 is more specifically defined as an XYθ or aperture plate which can be employed in the system of the aforesaid U.S. Pat. No. 4,068,947 for planar and rotational alignment of a semiconductor wafer in the image or focal plane of a projection printing system.

Mounted on support plate 4, substantially opposite each flexure unit, are respective ones of three equiangularly spaced sensing heads 5, each including air sensor probes or nozzles 6, which are pivotally reciprocable over and away from the top surface of wafer 7 vacuum mounted on chuck pedestal 1. The air sensors operate in a conventional manner to sense pressure variations as ejected air is throttled by an approaching or receding surface of a workpiece, such as wafer 7. The sensors are pneumatic and function with pressure differential switches 8 (FIG. 2), which are suitably activated in accordance with the distance of the workpiece surface from the end of the sensing nozzles 6. The output of each pressure switch 8 is coupled to a suitable driving mechanism 9 which actuate the flexure units to move the chuck pedestal 1, and conversely wafer 7 to level and align its top surface within the focal or image plane of the optical system.

Best Mode for Carrying Out the Invention

As shown in FIG. 1, the support plate 4 is embodied as in XYθ plate which is incorporated onto a carriage plate 10 which is shown within the environment of a projection system as illustrated in FIG. 12 of the aforesaid U.S. Pat. No. 4,068,947, which as indicated is incorporated herein by reference thereto. The support plate is provided with an aperture 11 defining access to an image beam of any optical system such as a conventional projection system normally employed in the fabrication of semiconductor devices. The bottom surface of support plate 4 is normally planar which can conveniently be positioned to define a reference plane such as the image or focal plane 12 of the optical system in which the top surface of a wafer 7 is to be placed.

Figure 2A:
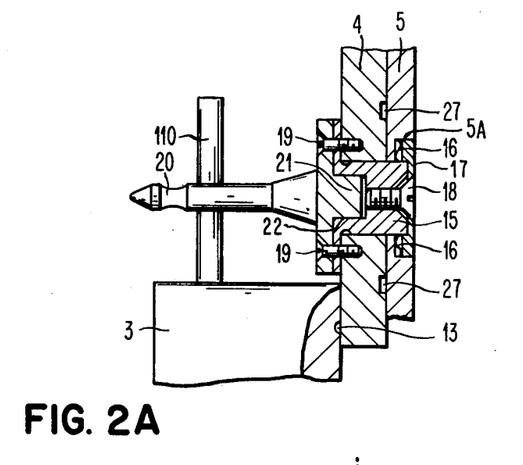
FIG. 2A is a partial view in section of means for mounting the chuck assembly in FIG. 2.

Formed in the bottom of supported plate 4 are vacuum grooves 13 which, when activated, function to hold a chuck assembly 14 in place against the bottom of the plate. Disposed on the top of XYθ plate 4 are three sensor heads 5 equiangularly spaced thereon. Each of the sensor heads 5 is pivotally mounted on a suitable axis such as a shaft 15 coated with a lubricating polymer (FIG. 2A). A ring spring 16 is enclosed in sensor head wells 5A by a cover plate 17 secured to shaft 15 by fastener 18 to bias the head against support plate 4. The opposite end of shaft 15 is flanged so as to enable it to be secured to the bottom of XYθ plate 4 by fasteners 19 together with a corresponding flange of registration pin 20. The setting or positioning of the registration pin 20 is insured by means of a stanchion 21, on the chuck assembly, which mates within an axial bore 22 on shaft 15.

The sensor heads 5 have two positions "in" and "out" under the control of two associated pneumatic cylinders 23 and 24 having plungers which act on respective shoulders 25 and 26 formed on sensor heads 5. When cylinders 23 are activated, via flexible tubing 28 to a source of pressure at manifold 29, the extension of their plungers against the shoulders 25 rotates the heads 5 to the "in" position which locates the sensor nozzle tips 6 over an associated flexure unit 2. Conversely, actuation of the "out" cylinders 24, via flexible tubing 30 to a pressure source at manifold 29, extends its plungers against the head shoulders 26 to rotate the head 5 on bearings 16 out of the field of the image beam of the optical system. Formed in the top of the XYθ plate 4 below the bottom of sensor heads 5 are grooves 27 which are connected (not shown) by flexible tubing to an alternate source of vacuum or air pressure. During rotation of sensor heads 5, the grooves 27 can be pressurized to emit a layer of air to form an air bearing to facilitate rotation of the heads. In the "read" and "rest" positions of heads 5, grooves 25 are connected to a source of vacuum to clamp the heads 5 in fixed positions on the XYθ plate 4. For the "read" position, over wafer 7, the sensor nozzle tips 6 are preset at a distance of 0.003±0.0002 inches from the reference plane defined by the bottom of the XYθ plate 4. The sensor nozzle 6 constitutes an air flow rate detecting element which provides a measure of the spacing of a workpiece surface from the end of the nozzle 6.

Positive air flow is provided to sensor nozzle 6 through a passageway 30, in sensor head 5, which extends through flexible tubing 31 to manifold 29, in turn connected by flexible tubing 31', to a sense outlet 32 of a pressure differential (P/D) switch 8.

Three pressure differential switches 8 are used to establish the focal plane for this system, one for each of sensor heads 5 and flexure elements 2, with it being understood that the focal plane is optically and mechanically aligned before the P/D switch 8 calibration by means of an optical flat (not shown) which is initially substituted for the wafer front surface.

The P/D switch 8 comprises a dielectric or insulating body 34 having an interior chamber in which is mounted a sensitive conductive and metallic bellows 35. The bellows defines two air chambers 36 and 37. A source of regulator air pressure (e.g. 16 psi) is connected to an inlet 38 which is bifurcated into two lateral passage runs 39 and 40. In this manner, a portion of air flows through a fixed restrictor 41 to the switch sense outlet 32 and to chamber 36. The remaining portion of the air flow passes through a fixed restrictor 42 (substantially equal to restrictor 41) to chamber 37 and to a control outlet 43 connected by flexible tubing 58 to a bias control valve 44.

The valve unit 44 is constructed of a single mass of metal 45 (e.g. 302 stainless steel) split into two cantilevered control arms 46 and 47 by means of kerfs 48 and 49. The spacing between the bights of kerfs 48 and 49 is thinned by means of suitable bores 50 and 51 to form a flexure joint 52 which provides proportional strength which provides adjustment capabilities by means of a coarse adjust set screw 53 and a fine adjust screw 54. Setting of the set screws 53 and 54 controls the spacing between a base leg 55 and lever arm 46 for control positioning of a valve pad 56 relative to an air bore 57 which is connected by flexible tubing 58 to the control outlet 43 of the P/D switch 8. Adjustment of the bias control valve 44 adjusts the division of air flow in P/D switch 8 in correlation with the desired distance of a workpiece surface from sensor nozzle end 6, e.g. when the surface is in the focal or image plane.

Figure 5:
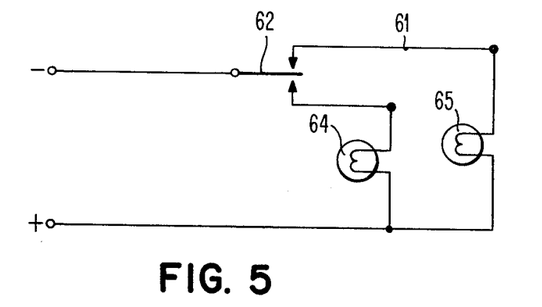
FIG. 5 shows a simplified electrical circuit of control elements in FIG. 2.

The P/D switch 8 sensing function is obtained by means of suitably formed contacts which form the basic electrical circuit of FIG. 5. The contacts include a low sense electrical contact 60 which extends into the chamber 36 within bellows 35 and an axially aligned high sense electrical contact 61 which extends into the switch chamber 37 externally of bellows 35. The circuit is completed by a common terminal 62 positioned in contact with the flange of the metallic bellows 35, which together with suitable circuitry (graphically illustrated as elements 64 and 65) in any suitable electronic control unit 66 activates the driver unit 9 for control of flexure elements 2.

In operation, with air pressure applied at the P/D switch inlet 38, the gap between the workpiece surface and probe nozzle end 6 dictates the degree of expansion of bellows 35 within the switch. When the gap of the surface at the probe nozzle 6 exceeds the callibrated distance to the focal or image plane (e.g. greater than 0.003"), the pressure in switch chamber 37 rises to a higher level than in switch chamber 36, to compress bellows 35 in contact against the low screw contact 60 to signal the driver unit 9 to continue to move the workpiece surface into closer proximity with the sensor probe 6. Inversely, if the workpiece surface is positioned at a closer gap beyond the focal or image plane (e.g. less than 0.003"), the pressure in bellows chamber 36 will rise to a point higher than that in switch chamber 37 to extend the bellows 35 into contact with the high electrical contact 61 to signal the driver unit 9 to move the workpiece surface away from the probe tip 6. When the three points of the surface are properly spaced at the three equiangularly spaced nozzle tips 6, the planar surface of the workpiece is levelled within the reference plane (e.g. optical or image plane).

A driver unit 9 is associated with each pair of probes and flexure units 2, and it is comprised of an air regulator 67 (e.g. a 1 to 60 psi Fairchild Model 70B) having a geared head 68 (e.g. 84 teeth) meshed with the teeth (42 teeth) of a gear 70 mounted on a drive motor 69 (e.g. Globe Motor Model #43A144-27). The rotation of motor 69 determines the pressure regulation of a suitable pressure source (e.g. 70–80 psi) to the flexure units 2, in response to the directional control from the electronic control unit 66 as specified by the P/D switch 8.

Figure 4:
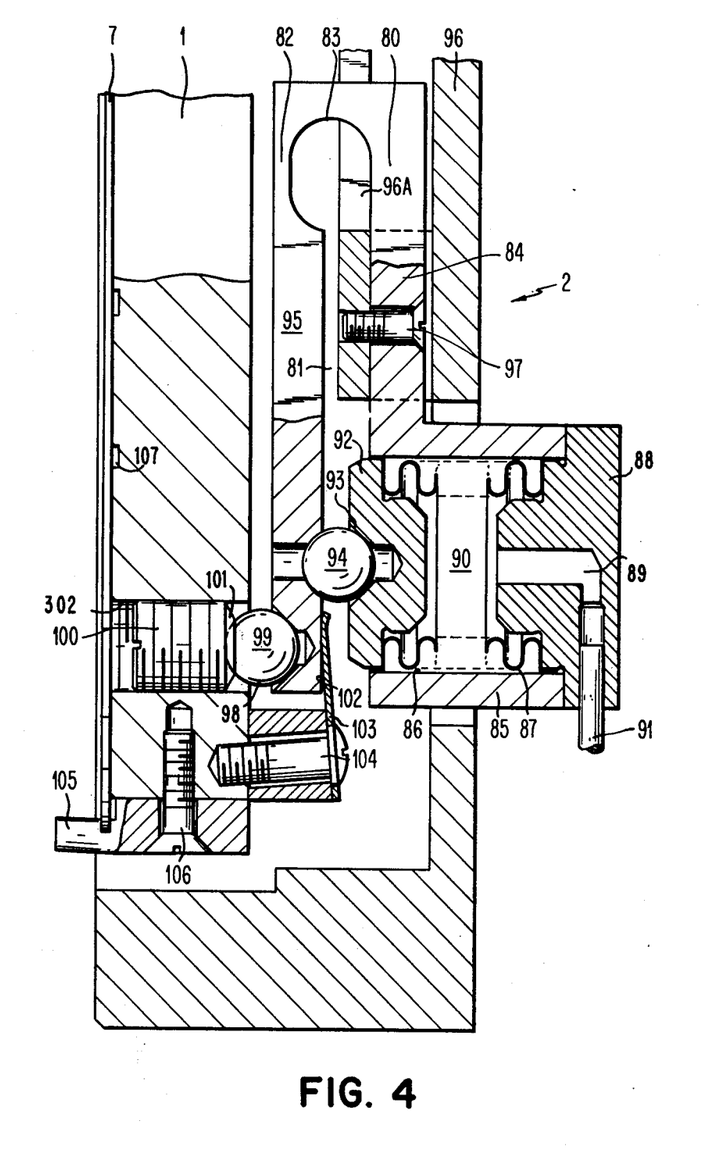
FIG. 4 is a partial view in section of the drive mechanism and assembly for the chuck of the preceding figure.

The details of the flexure units 2 are shown in FIG. 4 mounted within the cup-shaped chuck frame 3. As will be understood, three equiangularly flexure units are employed, each in association below a respective one of probe or sensor nozzles 6. These flexure units are formed from metal block 80 (e.g. 302 stainless steel) slit lengthwise as by a kerf 81 with a thinned portion 82 adjacent the kerf bight 83 to form a flexure joint to provide controlled deflection of the unit. The base leg 84 of the device is provided with a boss 85 having a bore 86 for mounting therein a bellows 87. The bellows is sealed in bore 86 by a cover cap 88 having a passageway 89 communicating from the cap port 91 to the bellows chamber 90. The opposite end of bellows 81 is sealed with a top plate 92 having a concave seat 93 for receiving a thrust ball 94 which is normally held in non-stressing abutment against the lever arm 95 of the flexure element 80. The base leg 84 of the flexure element is secured to chuck frame yoke 96A wall 96 by fasteners 97.

Provided at the end of lever arm 95 is a concave seat 98 for a pivot ball 99 which is mounted against the concave seat 101 of a bearing screw 100 secured in a threaded bore 302 of chuck pedestal 1. The flexure element 80 is pivotally clamped against pivot ball 99 at the shoulder portion 102, of lever arm 95, by means of a spring leaf retainer 103, which is secured to the bottom of the chuck pedestal 1 at a boss 104. Also provided at the periphery of the chuck pedestal 1, by fastener 106, is a locator pin 105 for mating with locator notches of a semiconductor wafer in preliminary alignment thereof on chuck pedestal 1. For securing a wafer on chuck pedestal 1, its top surface is provided with vacuum grooves 107 which are connected to a suitably controlled vacuum source by flexible tubing 108. Also, as shown in FIG. 2, the flexure unit bellows 87 are actuated by suitable tubing 109 extending between the bellows port 91 and the driver unit 9.

Equiangularly spaced about the periphery of the chuck frame 3 are location pins 110 having registration against for pre-mounting the XYθ plate registration pins 20 by gravity. The mounted chuck frame is secured to XYθ plate 4 by means of machined vacuum grooves 13. The XYθ plate 4 is mounted to carriage plate 112 through a focus ring 113 to which it is secured by means of at least three equiangularly spaced tension springs 114 extending through and secured at anchor pins 115 and 116 at the end of the bores 117 and 118 in the XYθ plate 4 and focus ring 113, respectively.

In turn, the focus ring 113 is mounted to the carriage plate 112 by means of a flexure blade or leaf spring 114 secured to the focus ring at point 215 thereat and to a lever arm 116. The lever arm 216 is pivotally mounted against a fulcrum ball 117. An adjusting screw 118 is provided at one end of lever arm 216 to act against carriage plate 112 so as to controllably pivot the lever arm 216, about fulcrum ball 217, for alignment of the XYθ plate face 119 into the reference plane 12, e.g. focal or image plane of an optical system. After setting of lever arm 216, it is locked into place by clamp screw 120 extending through an oversized bore 121 in the lever arm 216, into carriage plate 112. Focus ring 113 is also provided with a passageway 130 having an inlet 131 connected to an alternate source of air pressure or vacuum, with the opposite end terminating at the adjacent surfaces of the focus ring 113 and the XYθ plate 4. The function of passageway 130 is to lock the focus ring 113 and the XYθ plate 4 together, by connection to a source of vacuum, as required, e.g. wafer stage alignment operation, and during exposure in a projection printing system. Alternatively, when relative motion between the focus ring 113 and XYθ plate 4 is required (e.g. X-Y-θ alignment as in U.S. Pat. No. 4,068,947) an air bearing can be provided between them by connection of the focus ring passageway 130 to a pressurized gas source.

Figure 6:
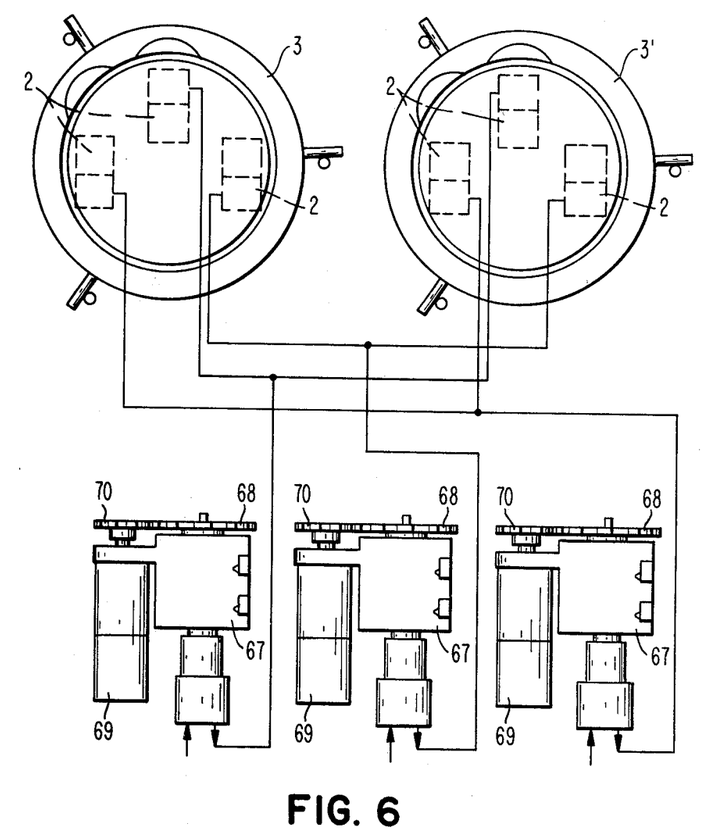
FIG. 6 shows an overall interrelationship of air drives with the chuck assemblies of this invention.

The pneumatic operation of the system is shown in FIG. 6 which illustrates the use of two chuck assemblies, one outboard chuck 3' on which a wafer is loaded while the inboard chuck 3 is being utilized in the optical system. Operation of the dual chuck arrangement is for all purposes comparable to that referred to in the aforesaid U.S. Pat. No. 4,068,947. As can be seen in FIG. 6, one set of drivers is provided for the two chuck arrangements. Although the arrangement shown involves concurrent pneumatic operation of the chuck assemblies, the arrangement does simplify the mechanical and electrical complexity substantially, while still maintaining a high performance level.

Figure 7:
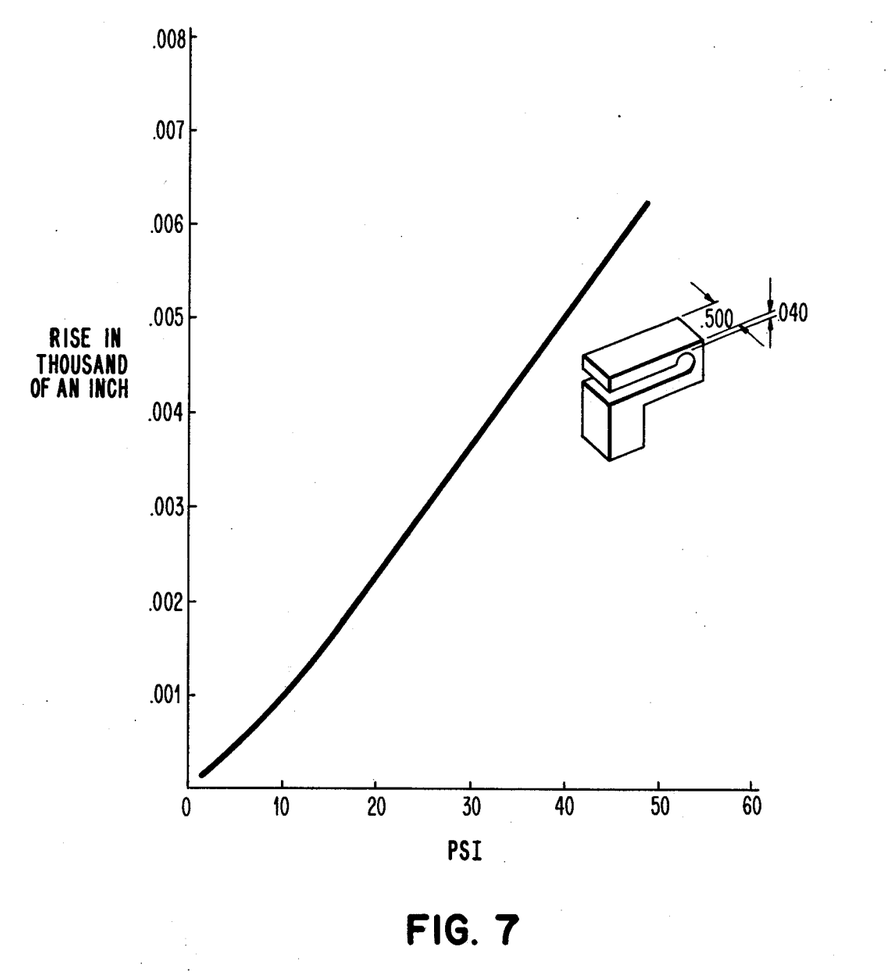
FIG. 7 shows performance curves for various flexure units employed in this invention.

In operation, the alignment of the XYθ plate surface 119 is preset in the reference plane 12 (e.g. image or focal plane) by means of the focus ring adjustment by adjustment of lever arm 116 utilizing an optical flat with the air probes 5 in position. The optical flat is retracted, and a semiconductor wafer inserted on the chuck pedestal 1. With the chuck frame 3 in position against the XYθ plate 4 and held thereon by vacuum in groove 13, the alignment system is activated. Air probes 5 are pivoted over the wafer 7 which controls the three flexure units to level and position the wafer system into the focus or image plane 12, by means of the P/D switch 33, the electronic control 66 and driver 9, as described above. Performance curves are shown in FIG. 7 for three different flexure element designs. Illustratively, the flexure lever arm 95 can be designed to provide a 0.005 to 0.006 mil travel since semiconductor wafers may have up to 0.003 mils out of parallelism, and ±0.0015 inches in thickness variations.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

Having thus described my invention, what is claimed as new, and desired to be secure by Letters Patent is:

1. A focusing apparatus adapted for positioning a planar object in a focal plane of an optical system, comprising:
 A. means for mounting said object and for positioning a planar surface thereof in parallel coninicidence in said focal plane of said system;
 B. at least three sensing means equiangularly disposed about the periphery of said focal plane for sensing the displacement of said surface from said focal plane;
 C. at least three reversible drive means for said mounting means and equiangularly disposed below corresponding ones of said sensing means; and
 D. means responsive to said sensing means for independently activating corresponding ones of said drive means for positioning said surface into coincidence with said focal plane; wherein
 E. said drive means comprises
   (a) a carrier for said mounting means;
   (b) an elastic metal block having a kerf extending therethrough with a thinned bight thereof defining a cantilevered resilient lever arm opposite a base portion of said block, with said base portion mounted to said carrier and said arm mounted at its distal end to said mounting means; and
   (c) a reversibly extensible means
     (i) between said distal portion and said base portion and
     (ii) responsive to said actuating means.

2. The apparatus of claim 1 wherein each said sensing means comprises an air probe adapted to coact with said surface.

3. The apparatus of claim 1 wherein said object comprises a semiconductor substrate.

4. The apparatus of claim 1 wherein said drive means comprises a pneumatically actuated bellows.

5. The apparatus of claim 4 wherein each said sensing means comprises an air probe adapted to coact with said surface.

6. The apparatus of claim 1 wherein said optical system is a projection printing system for semiconductor fabrication, and said focal plane comprises the image plane of said projection system.

7. The apparatus of claim 6 wherein each said sensing means comprises an air probe adapted to coact with said surface.

8. The apparatus of claim 6 wherein said drive means comprises a pneumatically actuated bellows.

9. The apparatus of claim 8 wherein each said sensing means comprises an air probe adapted to coact with said surface.

10. The apparatus of claims 2, 5, 7 or 9 including means for pivotally moving each said air probe over and away from said surface in a plane parallel to said focal plane.

* * * * *

UNITED STATES PATENT AND TRADEMARK OFFICE
CERTIFICATE OF CORRECTION

PATENT NO. : 4,198,159
DATED : April 15, 1980
INVENTOR(S) : Rene P. Cachon

It is certified that error appears in the above-identified patent and that said Letters Patent are hereby corrected as shown below:

Column 6, line 41, delete "117" and substitute therefor --217--.

Signed and Sealed this

Twenty-eighth Day of October 1980

[SEAL]

Attest:

Attesting Officer

SIDNEY A. DIAMOND

Commissioner of Patents and Trademarks